United States Patent
Ueda et al.

(10) Patent No.: US 9,124,242 B2
(45) Date of Patent: Sep. 1, 2015

(54) FILTER, DUPLEXER, COMMUNICATION MODULE AND COMMUNICATION DEVICE

(75) Inventors: Masanori Ueda, Tokyo (JP); Takashi Matsuda, Tokyo (JP); Tokihiro Nishihara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 13/590,900

(22) Filed: Aug. 21, 2012

(65) Prior Publication Data

US 2012/0313726 A1     Dec. 13, 2012

Related U.S. Application Data

(63) Continuation of application No. PCT/JP2011/053629, filed on Feb. 21, 2011.

(30) Foreign Application Priority Data

Feb. 25, 2010    (JP) ................................ 2010-040661

(51) Int. Cl.
*H03H 9/70*       (2006.01)
*H03H 9/72*       (2006.01)
(Continued)

(52) U.S. Cl.
CPC .............. *H03H 9/605* (2013.01); *H03H 9/542* (2013.01); *H03H 9/6483* (2013.01); *H03H 9/706* (2013.01);
(Continued)

(58) Field of Classification Search
CPC ......... H03H 7/01; H03H 7/075; H03H 7/123; H03H 7/138; H03H 7/1708; H03H 7/463; H03H 7/741; H03H 9/542; H03H 9/605; H03H 9/6483; H03H 9/706; H03H 9/725; H03H 9/568
USPC ........... 333/189–196, 133; 310/313 B, 313 D
See application file for complete search history.

(56) References Cited

U.S. PATENT DOCUMENTS 5,933,062 A *   8/1999   Kommrusch ................. 333/193
6,879,224 B2 *   4/2005   Frank ............................ 333/189
(Continued)

FOREIGN PATENT DOCUMENTS

CN         1518219 A       8/2004
EP          1 126 604   *   8/2001
(Continued)

OTHER PUBLICATIONS

V. Novgorodov et al.; "Modified Ladder-Type 2.4GHz SAW Filter with Transmission Zero"; 2010 IEEE International Ultrasonics Symposium (IUS) Proceedings, Oct. 11-14, 2010, pp. 2083-2086.*
(Continued)

*Primary Examiner* — Barbara Summons
(74) *Attorney, Agent, or Firm* — Chen Yoshimura LLP

(57) ABSTRACT

A filter includes a plurality of primary resonators connected to a serial arm, a plurality of secondary resonators connected to a parallel arm, a primary inductor connected to at least one of the plurality of primary resonators and a secondary inductor connected to at least one of the plurality of secondary resonators. The primary inductor is arranged so as not to be connected to a path between the secondary resonator to which the secondary inductor is connected in parallel and the primary resonator that is connected to the secondary resonator to which the secondary inductor is connected in parallel.

5 Claims, 9 Drawing Sheets

(51) Int. Cl.
  *H03H 9/54*    (2006.01)
  *H03H 9/60*    (2006.01)
  *H03H 9/64*    (2006.01)
  *H03H 7/075*   (2006.01)
  *H03H 7/46*    (2006.01)
  *H03H 9/56*        (2006.01)
  *H03H 7/01*        (2006.01)

(52) U.S. Cl.
  CPC ............ *H03H 9/725* (2013.01); *H03H 7/0123* (2013.01); *H03H 7/0138* (2013.01); *H03H 7/075* (2013.01); *H03H 7/463* (2013.01); *H03H 9/568* (2013.01)
  USPC ............ 333/133; 333/189; 333/193; 333/195

(56) References Cited

U.S. PATENT DOCUMENTS

| | | | |
|---|---|---|---|
| 6,909,338 B2 * | 6/2005 | Omote | 333/133 |
| 6,943,645 B2 * | 9/2005 | Taniguchi | 333/133 |
| 6,995,631 B2 * | 2/2006 | Taniguchi | 333/133 |
| 7,230,510 B2 * | 6/2007 | Lobeek | 333/133 |
| 2004/0058664 A1 | 3/2004 | Yamamoto et al. | |
| 2007/0013459 A1 | 1/2007 | Mimura et al. | |
| 2007/0030096 A1 | 2/2007 | Nishihara et al. | |
| 2007/0159274 A1 | 7/2007 | Onzuka | |
| 2008/0258983 A1 | 10/2008 | Bauer et al. | |
| 2009/0002095 A1 | 1/2009 | Terada et al. | |
| 2010/0109800 A1 | 5/2010 | Ueda et al. | |

FOREIGN PATENT DOCUMENTS

| | | | |
|---|---|---|---|
| JP | 6-260876 A | | 9/1994 |
| JP | 7-231241 | * | 8/1995 ............ 333/193 |
| JP | 2000-151356 | * | 5/2000 |
| JP | 2001-244704 | * | 9/2001 |
| JP | 2003-283363 A | | 10/2003 |
| JP | 2004-23655 A | | 1/2004 |
| JP | 2004-135322 A | | 4/2004 |
| JP | 2004-242281 A | | 8/2004 |
| JP | 2007-74698 A | | 3/2007 |
| JP | 2007-202136 A | | 8/2007 |
| JP | 2008-11151 A | | 1/2008 |
| JP | 2009-33733 A | | 2/2009 |
| JP | 2009-514275 A | | 4/2009 |
| WO | 2005/088836 A1 | | 9/2005 |
| WO | 2009/025056 A1 | | 2/2009 |

OTHER PUBLICATIONS

Written Opinion (PCT/ISA/237) issued in PCT/JP2011/053629 mailed in Apr. 2011.

International Search Report (ISR) issued in PCT/JP2011/053629 mailed in Apr. 2011.

Japanese Office Action dated Oct. 24, 2013, in a counterpart Japanese patent application No. 2010-040661.

Japanese Office Action dated Mar. 13, 2014, in a counterpart Japanese patent application No. 2010-040661.

Chinese Office Action dated May 6, 2014, in a counterpart Chinese patent application No. 201180010162.8.

Japanese Office Action dated Sep. 25, 2014, in a counterpart Japanese patent application No. 2010-040661.

Chinese Office Action dated Dec. 3, 2014, in a counterpart Chinese patent application No. 201180010162.8.

Chinese Office Action dated Jun. 3, 2015, in a counterpart Chinese patent application No. 201180010162.8.

* cited by examiner

FILTER, DUPLEXER, COMMUNICATION MODULE AND COMMUNICATION DEVICE

CROSS-REFERENCE TO RELATED APPLICATION

This application is a continuation of International Application No. PCT/JP2011/053629, filed on Feb. 21, 2011 and is based upon and claims the benefit of priority of the prior Japanese Patent Application No. 2010-040661, filed on Feb. 25, 2010, the entire contents of which are incorporated herein by reference.

FIELD

The disclosure of the present application relates to a filter, a duplexer, a communication module, and a communication device.

BACKGROUND

In recent years, the development has been underway of filter elements for high-frequency communications characterized in allowing only electronic signals in a certain frequency band to pass therethrough, which characteristic being achieved by the combination of a plurality of resonators using surface acoustic waves (SAWs) by using a piezoelectric material or resonators using thickness vibration waves of a piezoelectric film (FBARs). Because filter components utilizing SAW resonators or FBARs are smaller in outer size than other dielectric and ceramics filters and have steep roll-off properties, they are suitable for components of mobile communication devices such as mobile phones whose components need to be small and have a narrow fractional bandwidth. Duplexers are components to which SAW or FBAR ladder filters are applied. Duplexers have been used in wireless devices that have transmission and reception capabilities and transmit and receive signals of different frequencies. Insertion losses resulting from filters and duplexers can have a huge impact on device properties.

Patent Documents 1 and 2 disclose that an inductor is added to a ladder filter to improve the filter properties.

Patent Document 1: JP 2004-135322 A
Patent Document 2: JP 2009-514275 A

However, inventors found that it is difficult to increase the bandwidth of the ladder filters disclosed in Patent Documents 1 and 2, and losses occur in the passband of these filters.

SUMMARY

An example of a filter disclosed in the present application includes: a plurality of primary resonators connected to a serial arm; a plurality of secondary resonators connected to a parallel arm; a primary inductor connected to at least one of the plurality of primary resonators; and a secondary inductor connected to at least one of the plurality of secondary resonators. The primary inductor is arranged so as not to be connected to a path between the primary resonators and the secondary resonator to which the secondary inductor is connected in parallel.

An example of a duplexer disclosed in the present application includes the above filter.

An example of a communication module disclosed in the present application includes the above filter.

An example of a communication device disclosed in the present application includes the above filter.

The object and advantages of the invention will be realized and attained by means of the elements and combinations particularly pointed out in the appended claims. It is to be understood that both the foregoing general description and the following detailed description are exemplary and explanatory only and are not restrictive of the invention, as claimed.

EMBODIMENT 1

[1. Configuration of Filter]

Figure 2:
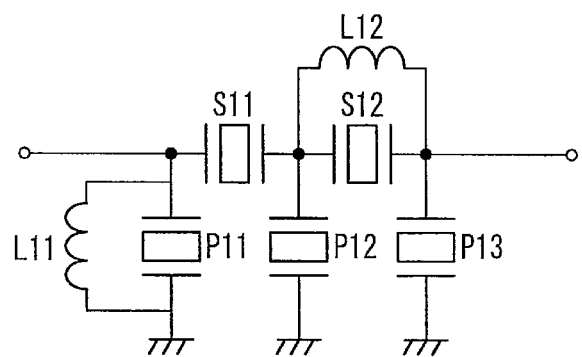
FIG. 2 shows a circuit diagram of a ladder filter as an example.
Figure 3:
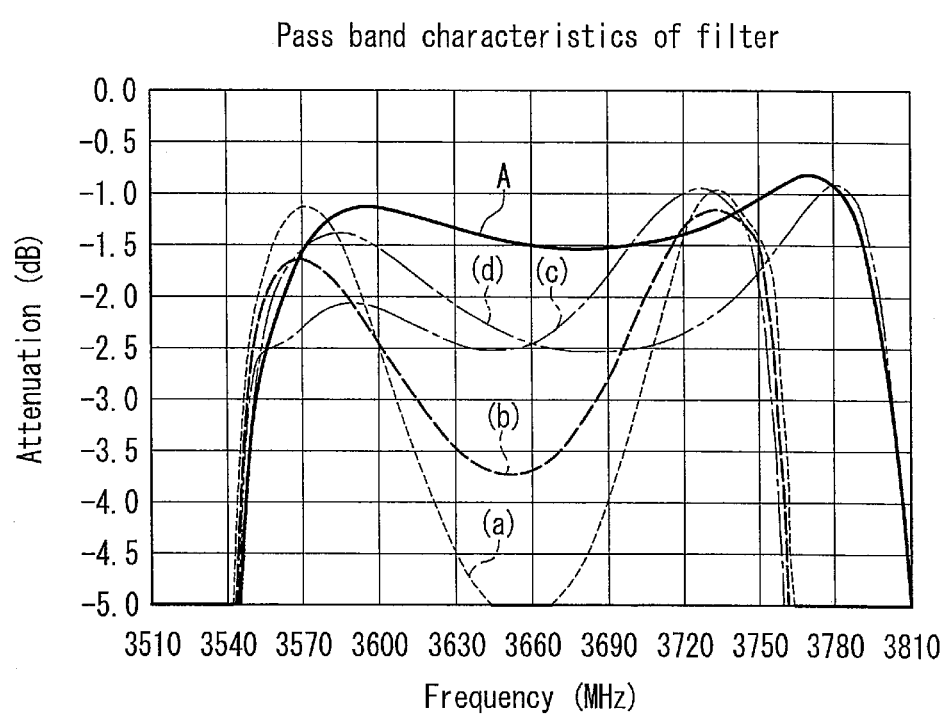
FIG. 3 is a graph showing the band pass characteristics of the filters shown in FIGS. 1 and 2.

FIG. 1 shows circuit diagrams of ladder filters as examples for comparison purposes. FIG. 2 shows a circuit diagram of a ladder filter as an example. FIG. 3 shows the band pass characteristics of each ladder filter shown in FIGS. 1 and 2. Curves (a) to (d) shown in FIG. 3 respectively correspond to the characteristics of the ladder filters shown in FIGS. 1A to 1D.

Figure 1A:
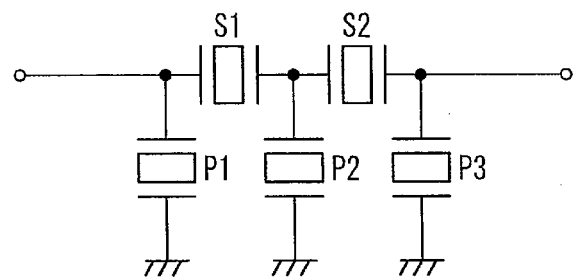
FIG. 1 shows circuit diagrams of ladder filters as examples for comparative purposes.
Figure 1B:
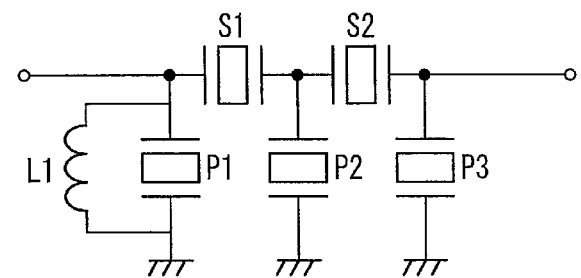
Figure 1C:
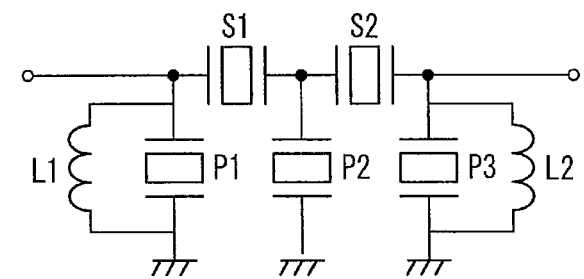

In each of the ladder filters shown in FIGS. 1A to 1C, serial resonators S1 and S2 are connected to a serial arm and parallel resonators P1 to P3 are connected to parallel arms. Each of the serial resonators S1 and S2 and the parallel resonators P1 to P3 can be implemented by, for example, an FBAR. For example, as for the constants, each resonator has a capacity ratio y (expressed as the ratio between the interterminal capacity and the equivalent capacity of acoustic circuit) of 16, a resonance Q of 680, and an anti-resonance Q of 1100. The resonance frequency of the serial resonators S1 and S2 is, for example, 3.7 GHz. The resonance frequency of the parallel resonators P1 to P3 is, for example, 3.5 GHz. In the ladder filter shown in FIG. 1B, an inductor L1 is connected to the parallel resonator P1 in parallel. In the ladder filter shown in FIG. 1C, an inductor L1 is connected to the parallel resonator P1 in parallel and an inductor L2 is connected to the parallel resonator P3 in parallel. The value of each of the inductors L1 and L2 is, for example, 4.6 nH.

Figure 1D:
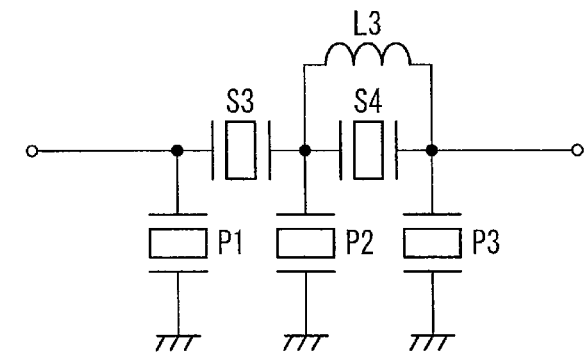

In the ladder filter shown in FIG. 1D, serial resonators S3 and S4 are connected to a serial arm and parallel resonators P1 to P3 are connected to parallel arms. In the ladder filter shown in FIG. 1D, an inductor L3 is connected to the serial resonator S4 in parallel. The resonance frequency of the serial resonator S3 is, for example, 3.75 GHz. The resonance frequency of the serial resonator S4 is, for example, 3.6 GHz. The resonance frequency of the parallel resonators P1 to P3 is, for example, 3.5 GHz. The value of the inductor L3 is, for example, 2 nH.

As shown by the curve (a) in FIG. 3 representing the characteristic of the ladder filter shown in FIG. 1A, the ladder filter shown in FIG. 1A hugely attenuates signals in a frequency band around the middle of the passband, and has large losses. In contrast, by connecting inductors to resonators of a ladder filter as shown in FIGS. 1B to 1D, attenuation in a frequency band around the middle of the passband can be reduced as shown by the curves (b) to (d) in FIG. 3 representing the characteristics of the ladder filters shown in FIGS. 1B to 1D, respectively, in comparison with the attenuation indicated by the curve (a). However, it is hard to say that the characteristics as indicated by the curves (b) to (d) in FIG. 3 are low-loss band pass characteristics.

In the ladder filter shown in FIG. 2, an inductor L11 is connected to a parallel resonator P11 in parallel, and an inductor L12 is connected to a serial resonator S12 in parallel. The inductor L11 is connected to the path between the serial resonator S11 and the parallel resonator P11. The inductor 12 is connected to the path between the serial resonator S12 and the parallel resonator P12 and to the path between the serial resonator S12 and the parallel resonator P13. That is, the path to which the inductor L11 is connected and the path to which the inductor L12 is connected are at different locations. The resonance frequency of the serial resonator S11 is, for example, 3.75 GHz. The resonance frequency of the serial resonator S12 is, for example, 3.6 GHz. The resonance frequency of the parallel resonators P11 to P13 is, for example, 3.5 GHz. The value of the inductor L11 is, for example, 4.6 nH. The value of the inductor L12 is, for example, 2 nH.

The ladder filter shown in FIG. 2 as an example is different from the ladder filters shown in FIG. 1 as examples for comparison purposes in that one of the plurality of inductors is connected to the serial arm, and the other is connected to the parallel arm. As shown by the curve A in FIG. 3 representing the characteristic of the ladder filter shown in FIG. 2, in a frequency band around the middle of the passband of the ladder filter shown in FIG. 2, attenuation is more suppressed than those shown by the curves (a) to (d), so that losses can be reduced. Further, as shown by the curve A in FIG. 3, it is possible to increase the bandwidth of the passband in comparison with those indicated by the curves (a) to (c).

Although the connection of inductors to a serial arm and a parallel arm of a ladder filter brings about changes in the band pass characteristics of the filter, the band pass characteristics also can change depending on where inductors are connected. Hereinafter, the relationship between the passband characteristics of a ladder filter and locations where inductors are connected will be explained.

Figure 4A:
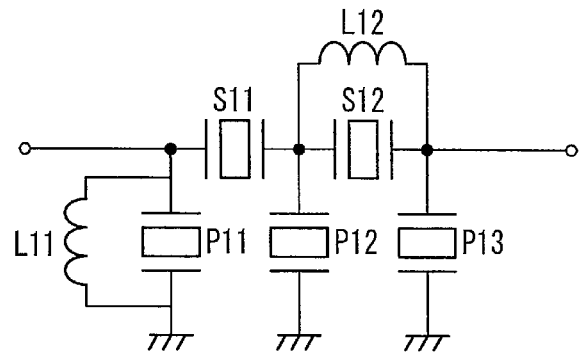
FIG. 4 shows circuit diagrams of an example of ladder filters including a plurality of inductors.
Figure 4B:
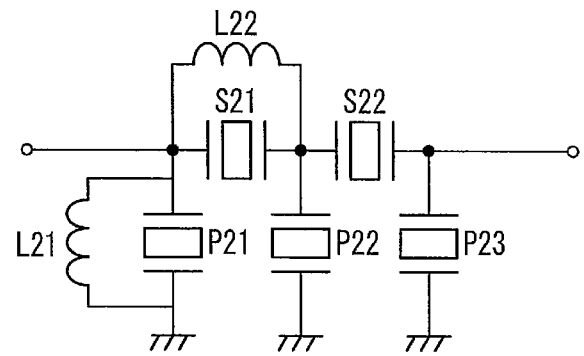
Figure 4C:
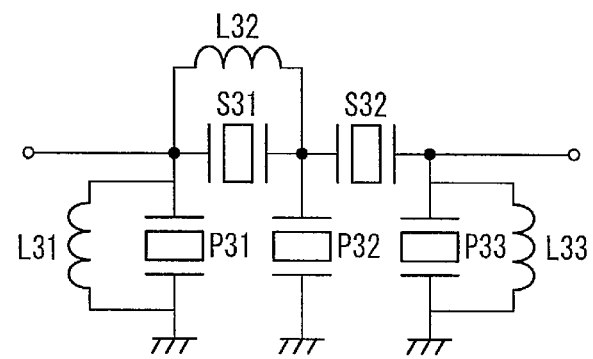

FIG. 4A shows a ladder filter in which an inductor L11 is connected to a parallel resonator P11 in parallel, and an inductor L12 is connected to a serial resonator S12 in parallel. FIG. 4B shows a ladder filter in which an inductor L21 is connected to a parallel resonator P21 in parallel, and an inductor L22 is connected to a serial resonator S21 in parallel. The inductors L21 and L22 are connected to the path between the serial resonator S21 and the parallel resonator P21. FIG. 4C shows a ladder filter in which an inductor L31 is connected to a parallel resonator P31 in parallel, an inductor L32 is connected to a serial resonator S31 in parallel, and an inductor L33 is connected to a parallel resonator P33 in parallel. The inductors L31 and L32 are connected to the path between the serial resonator S31 and the parallel resonator P31. In the ladder filters shown in FIG. 4, the constants of each resonator and inductor are equal to those of each resonator and inductor shown in FIG. 1 or 2.

Figure 5:
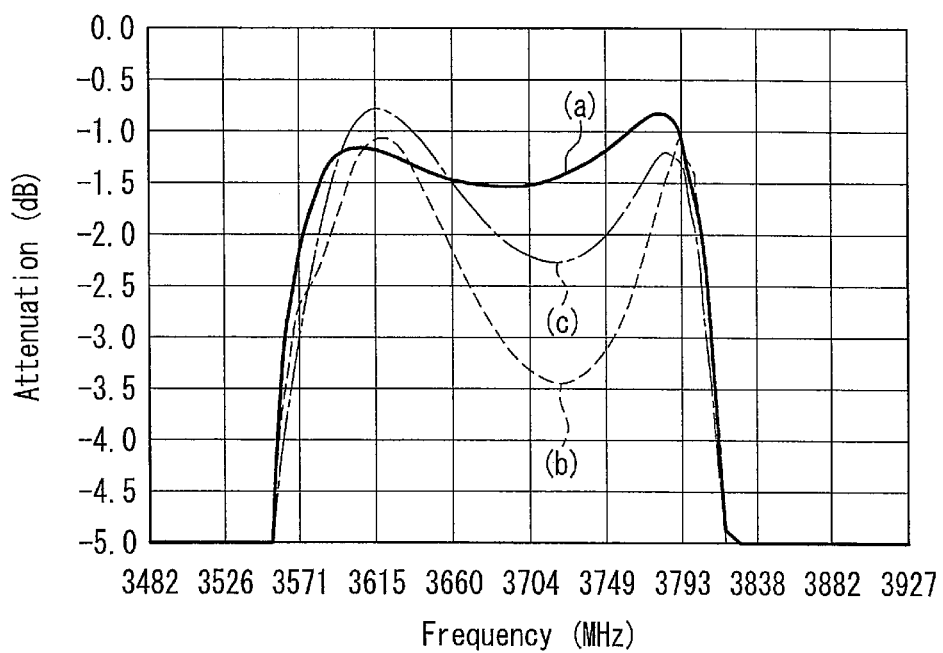
FIG. 5 is a graph showing the band pass characteristics of the filters shown in FIG. 4.

FIG. 5 shows the band pass characteristics of the ladder filters shown in FIGS. 4A to 4C. As shown in FIG. 4A, when the inductors L11 and L12 are connected to different paths from each other (connected to the path running through the serial arm and the path running through the parallel arm), the attenuation does not increase around the middle of the passband as shown by the curve (a) in FIG. 5 representing the characteristic of the ladder filter shown in FIG. 4A, so that low-loss passband characteristics can be achieved.

On the other hand, as shown in FIG. 4B, when the inductors L21 and L22 are connected to the same path, as shown by the curve (b) in FIG. 5, attenuation around the middle of the passband becomes larger than the attenuation indicted by the curve (a), so that losses increase.

Further, as shown in FIG. 4C, when the inductors L31 and L32 are connected to the same path and the inductors L32 and L33 are connected to different paths from each other (i.e., when the inductor is added to one of the parallel arms of the ladder filter shown in FIG. 4B), as shown by the curve (c) in FIG. 5, attenuation around the middle of the passband becomes smaller than the attenuation indicated by the curve (b). Even still, the attenuation around the middle of the passband is larger than the attenuation shown by the curve (a). Therefore, it is hard to say that the characteristic indicated by the curve (c) is low-loss.

As shown in FIG. 4A, by connecting the inductor L11 connected to the parallel arm and the inductor L12 connected to the serial arm to different paths from each other (to the path running through the serial arm and to the path running through the parallel arm), a low-loss ladder filter can be achieved.

Hereinafter, the effects attained by the ladder filter shown in FIG. 4A will be explained in more detail.

Figure 6A:
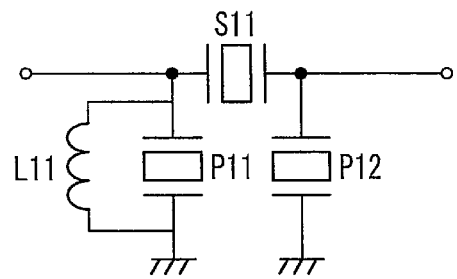
FIG. 6 shows circuit diagrams of an example of input and output stages of ladder filters.
Figure 6B:
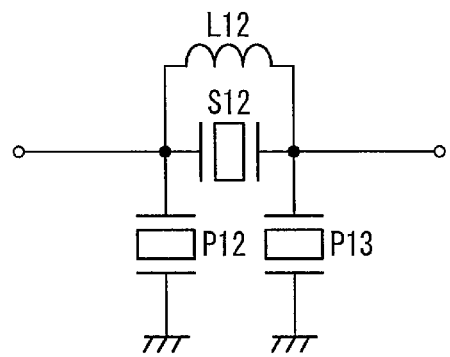
Figure 6C:
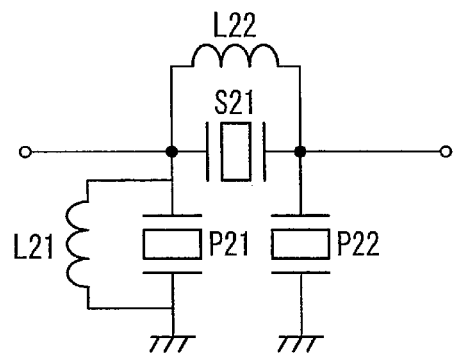
Figure 6D:
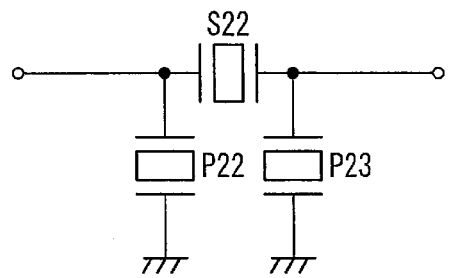

FIG. 6A shows two input stages of the ladder filter shown in FIG. 4A. FIG. 6B shows two output stages of the ladder filter shown in FIG. 4A. FIG. 6C shows two input stages of the ladder filter shown in FIG. 4B. FIG. 6D shows two output stages of the ladder filter shown in FIG. 4B. Note than one stage of the ladder filter is composed of one serial resonator and one parallel resonator. For example, in FIG. 6A, the stage composed of the serial resonator S11 and the parallel resonator P11 is the first stage of the ladder filter, and the stage composed of the serial resonator S11 and the parallel resonator P12 is the second stage of the ladder filter.

Figure 7:
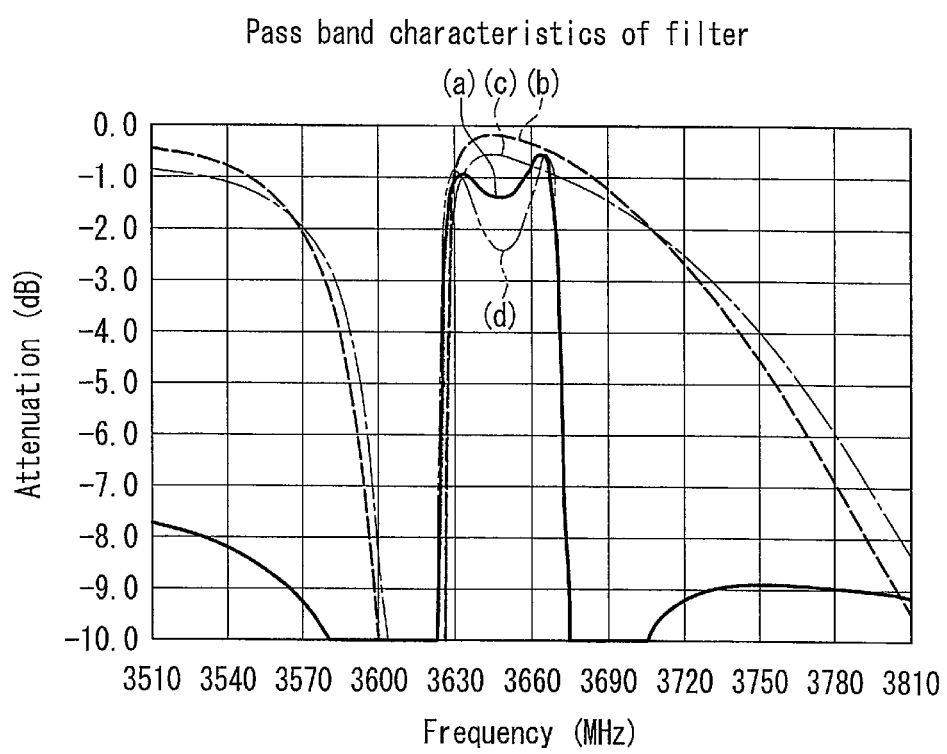
FIG. 7 is a graph showing the band pass characteristics of the stages shown in FIG. 6.

FIG. 7 shows the band pass characteristics of the stages of the ladder filters shown in FIG. 6A to 6D. The curves (a) to (d) in FIG. 7 respectively correspond to the band pass characteristics of the stages of the ladder filters shown in FIG. 6A to 6D. The ladder filter having the stages shown in FIGS. 6A and 6B has band pass characteristics that can be indicated by the combination of the curves (a) and (b) shown in FIG. 7. On the other hand, the ladder filter having the stages shown in FIGS. 6C and 6D has band pass characteristics that can be indicated by the combination of the curves (c) and (d) shown in FIG. 7. That is, in the ladder filter having the stages shown in FIGS. 6A and 6B, in other words, in the ladder filter shown in FIG. 4A, input and output impedances can be matched, so that losses can be reduced and the bandwidth can be increased. On the other hand, for the ladder filter having the stages shown in FIGS. 6C and 6D, in other words, the ladder filter shown in FIG. 4B, it is difficult to match input and output impedances, so that a reduction in losses and an increase in the bandwidth are hard to achieve.

An FBAR is used to implement each resonator in the present embodiment. However, effects similar to those of the present embodiment can be achieved even if a SAW device is used to implement each resonator.

[2. Configuration of Duplexer]

Devices for mobile communications (high-frequency wireless communications) such as mobile phone terminals, PHS (personal handy-phone system) terminals and terminals for wireless LAN systems are equipped with duplexers. Duplexers are used in wireless devices that are capable of transmitting and receiving communication radio waves or the like and transmit and receive signals of different frequencies.

Figure 8:
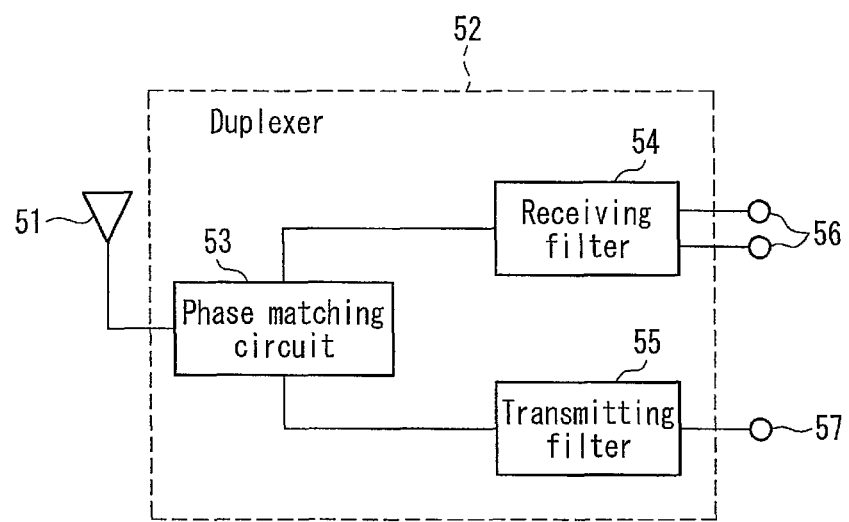
FIG. 8 is a block diagram of an example of a duplexer.

FIG. 8 shows a configuration of a duplexer equipped with the filter according to the present embodiment. The duplexer 52 includes a phase matching circuit 53, a receiving filter 54 and a transmitting filter 55. The phase matching circuit 53 is an element for phase-adjusting the impedance of the receiving filter 54 so as to prevent transmission signals outputted from the transmitting filter 55 from flowing into the receiving filter 54. An antenna 51 is connected to the phase matching circuit 53. The receiving filter 54 is composed of a band pass filter, though which, of reception signals inputted thereto through the antenna 51, only signals in a certain frequency band are allowed to pass. Further, output terminals 56 are connected to the receiving filter 54. The transmitting filter 55 is composed of a band pass filter, though which, of transmission signals inputted thereto through an input terminal 57, only signals in a certain frequency band are allowed to pass. Further, the input terminal 57 is connected to the transmitting filter 55. Here, the receiving filter 54 includes the filter according to the present embodiment.

Through the adoption of the filter according to the present embodiment for a duplexer, a low-loss and broad-band duplexer can be achieved.

Although the output side of the receiving filter 54 shown in FIG. 8 is balanced, the output side may be single-ended.

[3. Configuration of Communication Module]

Figure 9:
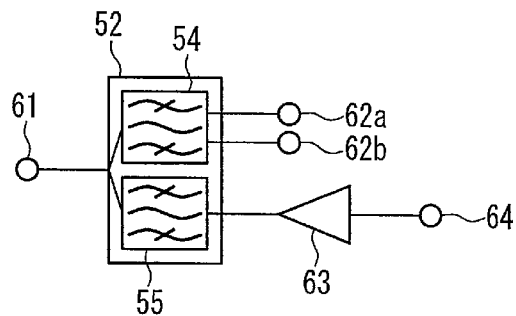
FIG. 9 is a block diagram of an example of a communication module.

FIG. 9 shows one example of a communication module equipped with the duplexer according to the present embodiment. As shown in FIG. 9, the duplexer 52 includes the receiving filter 54 and the transmitting filter 55. Further, to the receiving filter 54, the receiving terminals 56 compatible with a balanced output are connected, for example. Further, the transmitting filter 55 is connected to the transmitting terminal 57 through a power amplifier 74. Here, the receiving filter 54 includes the filter according to the present embodiment.

Of reception signals inputted to the receiving filter 54 through an antenna terminal 61, only signals in a certain frequency band are allowed to pass through during the reception operation, and are outputted externally from the receiving terminals 56. Further, of transmission signals inputted from the transmitting terminal 57 and amplified by the power amplifier 74, only signals in a certain frequency band are allowed to pass through the transmitting filter 55 during the transmission operation, and are outputted externally from the antenna terminal 61.

Through the adoption of the filter according to the present embodiment for a communication module, a low-loss and broad-band communication module can be achieved.

Note that the configuration of the communication module shown in FIG. 9 is merely an example. Even if the duplexer according to the present embodiment is incorporated into a communication module in other form, the same effects can be still achieved.

[4. Configuration of Communication Device]

Figure 10:
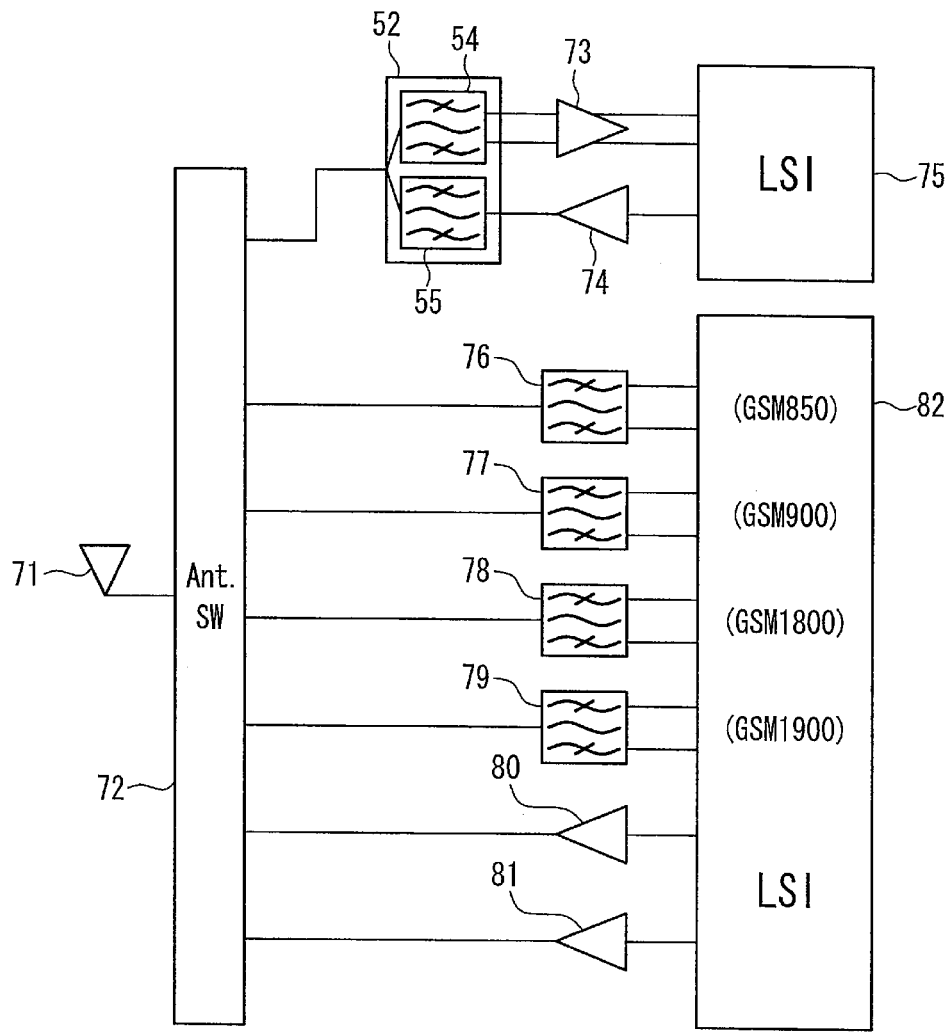
FIG. 10 is a block diagram of an example of a communication device.

FIG. 10 shows an RF block of a mobile phone terminal as one example of a communication device including the duplexer according to the present embodiment or the communication module as described above. The communication device whose configuration is shown in FIG. 10 can be used as a mobile phone terminal compatible with the GSM (Global System for Mobile Communications) communication system and the W-CDMA (Wideband Code Division Multiple Access) communication system, for example. The GSM communication system in the present embodiment supports 850 MHz, 950 MHz, 1.8 GHz and 1.9 GHz bands. In addition to the components shown in FIG. 10, the mobile phone terminal also includes a microphone, a speaker, a liquid crystal display and the like but these components are not illustrated because they are irrelevant to the description of the present embodiment. Here, the receiving filter 54 of the duplexer 52 includes the filter according to the present embodiment.

First, an antenna switching circuit 72 selects an LSI to be operated based on the communication system of reception signals inputted thereto through an antenna 71, i.e., based on whether the communication system is W-CDMA or GSM. When the inputted reception signals correspond to the W-CDMA communication system, switching is performed to output the reception signals to the duplexer 52. The reception signals inputted to the duplexer 52 are limited to those in a certain frequency band through the receiving filter 54, so that balanced reception signals are outputted to a LNA 73. The LNA 73 amplifies the inputted reception signals and outputs the amplified reception signals to an LSI 75. Based on the inputted reception signals, the LSI 75 decodes the signals into audio signals and controls the operation of each portion of the mobile phone terminal.

On the other hand, when transmitting signals, the LSI 75 produces transmission signals. The transmission signals produced are amplified by the power amplifier 74 and are inputted to the transmitting filter 55. Of the transmission signals inputted to the transmitting filter 55, only signals in a certain frequency band are allowed to pass therethrough. The transmission signals outputted from the transmitting filter 55 are outputted externally from the antenna 71 through the antenna switching circuit 72.

Further, when the inputted reception signals are signals corresponding to the GSM communication system, the antenna switching circuit 72 selects one of receiving filters 76 to 79 based on the frequency bands of the signals, and outputs the reception signals to the selected receiving filter. The reception signals limited by one of the receiving filters 76 to 79 to a certain frequency band are inputted to an LSI 82. Based on the inputted reception signals, the LSI 82 decodes the signals into audio signals and controls the operation of each portion of the mobile phone terminal. On the other hand, when transmitting signals, the LSI 82 produces transmission signals. The transmission signals produced are amplified by a power amplifier 80 or 81 and are outputted externally from the antenna 71 through the antenna switching circuit 72.

Through the adoption of the filter according to the present embodiment for a communication device, a low-loss and broad-band communication device can be achieved. Note that the configuration of the communication device shown in FIG. 10 is merely an example. Even if the duplexer according to the present embodiment is incorporated into a communication device in other form, the same effects can be still achieved.

[5. Effects of Embodiment, etc.]

According to the present embodiment, it is possible to achieve a low-loss and broad-band ladder filter. That is, in the ladder filter according to the present embodiment, the inductor L11 is connected in parallel to the parallel resonator P11 on the input side and the inductor L12 is connected in parallel to the serial resonator S12 on the output side. The inductors L11 and L12 are connected to different paths from each other (to a path running through the serial resonator and to a path running through the parallel resonator). Because of having such a configuration, input and output impedances can be matched. Thus, a low-loss and broad-band ladder filter can be achieved.

In the ladder filter according to the present embodiment, the inductor L11 is connected in parallel to the parallel resonator on the input side (e.g., the parallel resonator P11), and the inductor L12 is connected in parallel to the serial resonator on the output side (e.g., the serial resonator S12). It is to be noted that the inductor L11 may be connected in parallel to the serial resonator on the input side (e.g., the serial resonator S11) and the inductor L12 may be connected in parallel to the parallel resonator on the output side (e.g., the parallel resonator P13).

The serial resonators S11 and S12 in the present embodiment are examples of the primary resonators of the present invention. The parallel resonators P11, P12 and P13 in the present embodiment are examples of the secondary resonators of the present invention. The inductor L11 in the present embodiment is an example of the primary inductor of the present invention. The inductor L12 in the present embodiment is an example of the secondary inductor of the present invention.

The present application is useful for a filter, a duplexer, a communication module and a communication device.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

The invention claimed is:
1. A filter comprising:
a plurality of primary resonators connected to a serial arm;
a plurality of secondary resonators connected to a parallel arm;
a primary inductor connected to at least one of the plurality of primary resonators in parallel; and
a secondary inductor connected to at least one of the plurality of secondary resonators in parallel,
wherein
the secondary resonator to which the secondary inductor is connected in parallel is connected to a segment of the serial arm, said segment being outside of a segment of the serial arm to which the primary inductor is connected in parallel, and
wherein an inductance of the secondary inductor is larger than an inductance of the primary inductor.
2. A duplexer comprising the filter according to claim 1.
3. A communication module comprising the filter according to claim 1.
4. A communication device comprising the filter according to claim 1.
5. A filter comprising:
a plurality of primary resonators connected to a serial arm;
a plurality of secondary resonators connected to a parallel arm;
a primary inductor connected to the serial arm in parallel with at least one of the plurality of primary resonators; and
a secondary inductor connected to the parallel arm in parallel with at least one of the plurality of secondary resonators,
wherein at least one primary resonator is connected between the primary inductor and the secondary inductor, and
wherein an inductance of the secondary inductor is larger than an inductance of the primary inductor.

* * * * *